United States Patent
Chen et al.

(10) Patent No.: US 9,661,726 B2
(45) Date of Patent: May 23, 2017

(54) INSULATION MACHINE PLATFORM, SUBSTRATE-CONTACT TYPE APPARATUS, AND STATIC ELECTRICITY ELIMINATION METHOD

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Cheng Chen, Beijing (CN); Yanming Lv, Beijing (CN); Xianxue Duan, Beijing (CN); Dezhi Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 119 days.

(21) Appl. No.: 14/740,921

(22) Filed: Jun. 16, 2015

(65) Prior Publication Data

US 2016/0278193 A1 Sep. 22, 2016

(30) Foreign Application Priority Data

Mar. 17, 2015 (CN) .......................... 2015 1 0117646

(51) Int. Cl.
*H01H 47/00* (2006.01)
*H05F 3/06* (2006.01)
(Continued)

(52) U.S. Cl.
CPC ............... *H05F 3/06* (2013.01); *H01T 19/04* (2013.01); *H05F 3/00* (2013.01);
(Continued)

(58) Field of Classification Search
USPC ........................................ 361/212, 220, 234
See application file for complete search history.

(56) References Cited

U.S. PATENT DOCUMENTS

2005/0045618 A1* 3/2005 Ito .......................... B32B 18/00
219/444.1
2012/0313308 A1* 12/2012 Yan ....................... B25B 11/005
269/21

FOREIGN PATENT DOCUMENTS

CN 2215387 Y 12/1995
CN 201015850 Y 2/2008
(Continued)

OTHER PUBLICATIONS

Third Chinese Office Action, for Chinese Patent Applicaiton No. 201510117646.2, dated Jul. 22, 2016, 13 pages.
(Continued)

*Primary Examiner* — Danny Nguyen
(74) *Attorney, Agent, or Firm* — Kinney & Lange, P.A.

(57) ABSTRACT

The present disclosure provides an insulation machine platform, a substrate-contact type apparatus, and a static electricity elimination method. The insulation machine platform includes: a machine platform body including at least one vent hole, and at least one static electricity elimination device; the at least one vent hole corresponds to the at least one static electricity elimination device being located at a position corresponding to the at least one vent hole, respectively, wherein the machine platform body has a supporting surface, underneath which the static electricity elimination device is located, for receiving a substrate. The substrate-contact type apparatus includes the insulation machine platform.

18 Claims, 3 Drawing Sheets

(51) Int. Cl.
  *H05F 3/00*   (2006.01)
  *H01T 19/04*   (2006.01)
  *H05K 9/00*   (2006.01)
  *H01L 21/683*  (2006.01)

(52) U.S. Cl.
  CPC .. *B65H 2301/5133* (2013.01); *H01L 21/6831* (2013.01); *H05K 9/0079* (2013.01)

(56) References Cited

FOREIGN PATENT DOCUMENTS

| | | |
|---|---|---|
| CN | 101178543 A | 5/2008 |
| CN | 101382414 A | 3/2009 |
| CN | 201484759 U | 5/2010 |
| CN | 102205541 A | 10/2011 |
| CN | 102254764 A | 11/2011 |
| CN | 203893506 U | 10/2014 |
| JP | S6436033 A | 2/1989 |
| JP | H11233599 A | 8/1999 |
| JP | 2000012663 A | 1/2000 |
| JP | 2001168067 A | 6/2001 |

OTHER PUBLICATIONS

Chinese Office Action and English translation dated Mar. 29, 2016, for corresponding Chinese Patent Application No. 201510117646.2.
Chines Office Action and English translation dated Nov. 18, 2015, for corresponding Chinese Patent Application No. 201510117646.2.
Chinese Decision of Rejection, for Chinese Patent Application No. 201510117646.2, dated Dec. 2, 2016, 12 pages.

\* cited by examiner

INSULATION MACHINE PLATFORM, SUBSTRATE-CONTACT TYPE APPARATUS, AND STATIC ELECTRICITY ELIMINATION METHOD

CROSS-REFERENCE TO RELATED APPLICATION

This application claims the benefit of Chinese Patent Application No. 201510117646.2 filed on Mar. 17, 2015 in the State Intellectual Property Office of China, the disclosure of which is incorporated in entirety herein by reference.

BACKGROUND OF THE INVENTION

Field of the Invention

The present disclosure relates to the technical field of liquid crystal display, in particular, relates to an insulation machine platform, a substrate-contact type apparatus, and a static electricity elimination method.

Description of the Related Art

An insulation machine platform is used for supporting a substrate, and then some processes are performed on the substrate, during manufacturing arrays, cells, etc. After the processes have ended, instantaneous static electricity accumulated on the substrate may become up to tens of hundreds volts, even to tens of thousands volts at the moment that the substrate is separated from the insulation machine platform, and an electric circuit and pixel structures on the substrate thereby may be destroyed. In order to protect the electric circuit and pixel structures on the substrate, it is desired to eliminate the static electricity on the substrate.

SUMMARY OF THE INVENTION

An embodiment of the present invention provides an insulation machine platform, comprising:

a machine platform body including at least one vent hole, and at least one static electricity elimination device;

wherein said at least one vent hole corresponds to said at least one static electricity elimination device being located at a position corresponding to said at least one vent hole, respectively, and wherein the machine platform body has a supporting surface, underneath which the static electricity elimination device is located, for receiving a substrate.

An embodiment of the present invention also provides a substrate-contact type apparatus including the above insulation machine platform.

An embodiment of the present invention also provides a static electricity elimination method, comprising steps of:

generating ion wind by means of a static electricity elimination device when a substrate is separated from a machine platform body;

directing the ion wind to the substrate through vent holes of the machine platform body; and eliminating the static electricity on the substrate by means of the ion wind.

BRIEF DESCRIPTION OF THE DRAWINGS

The above and other features of the present invention will become more apparent by describing in detail exemplary embodiments thereof with reference to the accompanying drawings by way of examples. Throughout the drawings, same reference numerals represent same or similar members.

DETAILED DESCRIPTION OF PREFERRED EMBODIMENTS OF THE INVENTION

Figure 1:
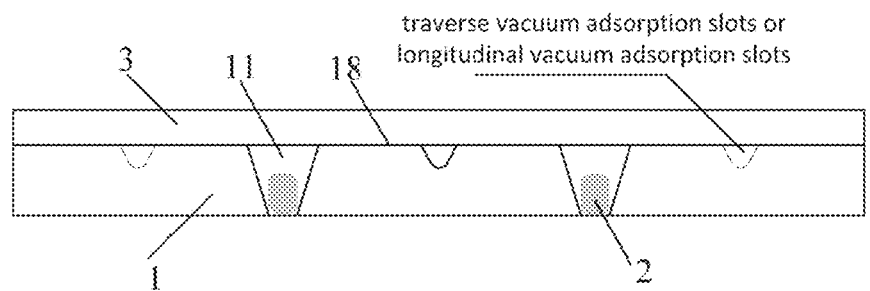
FIG. 1 is a schematic view showing a first construction of an insulation machine platform according to an embodiment of the present invention.

The embodiments of the present invention will be further explained below with reference to the figures and examples. It should be noted that same or similar reference numerals represent same or similar members or those having same or similar functions. The following embodiments are only explained by way of examples, instead of being intended to limit the scope of the present invention.

In accordance with a general invention concept of the present disclosure, an insulation machine platform is provided, comprising: a machine platform body including at least one vent hole, and at least one static electricity elimination device; wherein said at least one vent hole corresponds to said at least one static electricity elimination device being located at a position corresponding to said at least one vent hole, respectively, and wherein the machine platform body has a supporting surface, underneath which the static electricity elimination device is located, for receiving a substrate.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, according to an embodiment of the present invention, there is provided an insulation machine platform, comprising:

a machine platform body 1 including at least one vent hole 11, and at least one static electricity elimination device 2.

The at least one vent hole 11 corresponds to the at least one static electricity elimination device 2, respectively. The at least one static electricity elimination device 2 is located at a position corresponding to the at least one vent hole 11. The machine platform body 1 has a supporting surface 18 for receiving a substrate 3. The static electricity elimination device 2 is located underneath the supporting surface 18.

As an example, the static electricity elimination device 2 is located underneath the substrate 3 when the substrate 3 is placed on the machine platform body 1.

Since there are vent holes 11 in the machine platform body 1, the static electricity elimination device 2 located underneath the substrate 3 may direct all or most of generated ion wind to the substrate 3 through such vent holes 11, thereby improving static electricity elimination effect for the substrate 3, and eliminating effectively the instantaneous static electricity generated at the moment that the substrate 3 is separated from the machine platform body 1, thus preventing an electric circuit and pixel structures on the substrate 3 from being destroyed.

In an example, the machine platform body 1 is used for placing and fixing of the substrate 3. Referring to the machine platform body 1 shown in FIG. 2, the supporting surface 18 of the machine platform body 1 is provided with at least one non-vacuum adsorption zone 12, for example, at least two non-vacuum adsorption zones 12. The supporting surface 18 of the machine platform body 1 may also be provided with at least one vacuum adsorption slot, for example, traverse vacuum adsorption slots 13 and/or longitudinal vacuum adsorption slots 14, and any two non-vacuum adsorption zones 12 adjacent to each other may be partitioned by a vacuum adsorption slot (for example, one traverse vacuum adsorption slot 13 or one longitudinal vacuum adsorption slot 14).

As an example, it is possible to extract air from the traverse vacuum adsorption slots 13 and the longitudinal vacuum adsorption slots 14 when the substrate 3 is placed on the non-vacuum adsorption zones 12, to take out the air between the non-vacuum adsorption zones 12 and the substrate 3, such that the substrate 3 is attached and fixed to the non-vacuum adsorption zones 12.

Figure 2:
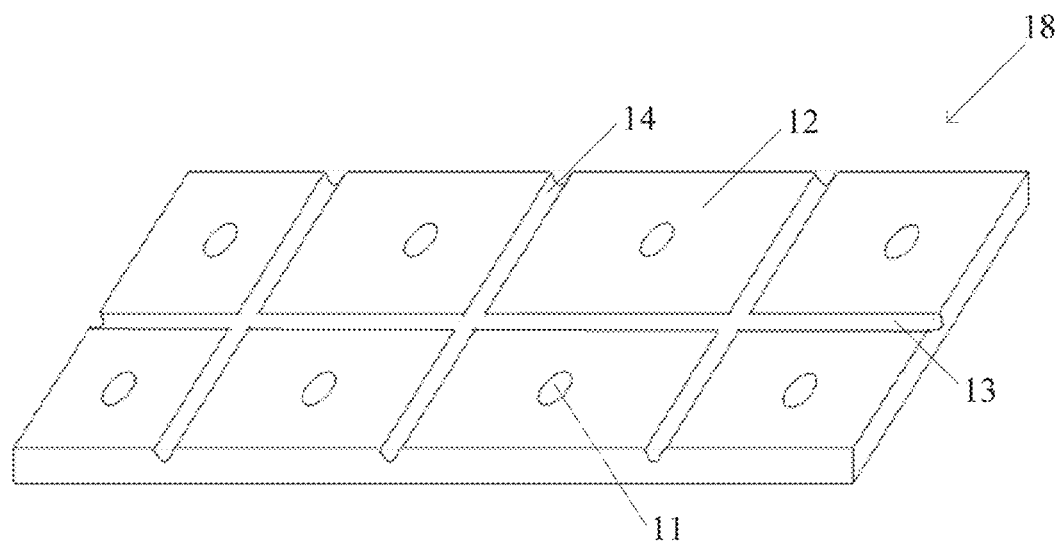
FIG. 2 is a structural schematic view showing a machine platform body according to an embodiment of the present invention.

Further, referring to FIG. 2, the at least one vent hole 11 included in the machine platform body 1 is evenly distributed in the non-vacuum adsorption zones 12.

As an example, each non-vacuum adsorption zone 12 may contain one or more vent holes 11. If there is one vent hole 11 in the non-vacuum adsorption zone 12, the vent hole 11 may be in the central position of the non-vacuum adsorption zone 12. If there is a plurality of vent holes in the non-vacuum adsorption zone 12, the vent holes 11 may be evenly distributed in the non-vacuum adsorption zone 12.

In an example, for each static electricity elimination device 2, it is located at a position corresponding to the vent hole 11 in the four following forms from the first to the fourth:

Referring to FIG. 1, in the first form of the static electricity elimination device 2, the static electricity elimination device 2 is embedded in the corresponding vent hole 11.

Since the static electricity elimination device 2 is embedded in the corresponding vent hole 11, all ion wind generated from the static electricity elimination device 2 may be directed to the substrate 3 above it, which avoids loss of the ion wind, thus improves static electricity elimination effect for the substrate 3.

In an example, the vent hole 11 may have a diameter (for example, maximum diameter) larger than or equal to the diameter (for example, maximum diameter) of the static electricity elimination device 2.

The larger the diameter of the vent hole 11 is, the larger the contact area between the ion wind generated from the static electricity elimination device 2 and the substrate 3 is, and the larger the contact area between the ion wind and the substrate 3 is, the better static electricity elimination effect of the ion wind for the substrate 3 is, therefore, the diameter (in case that the diameter of the vent hole 11 is variable, the maximum diameter is available) of the vent hole 11 may be arranged to be larger than the diameter (in case that the diameter of the static electricity elimination device 2 is variable, the maximum diameter is available) of the static electricity elimination device 2 to improve static electricity elimination effect.

However, to avoid degrading adsorption effect of the non-vacuum adsorption zones 12 to the substrate 3, the diameter of the vent hole 11 should not be overlarge, and it may be slightly larger than the diameter of the static electricity elimination device 2. The difference between the diameter (for example, maximum diameter) of the vent hole 11 and the diameter (for example, maximum diameter) of the static electricity elimination device 2 is generally within 3 mm, for example, the diameter (for example, maximum diameter) of the vent hole 11 may be 1 mm, 2 mm, or 3 mm, etc. larger than the diameter (for example, maximum diameter) of the static electricity elimination device 2.

In an example, in the vent hole 11, the static electricity elimination device 2 may be lower than the substrate 3.

The distance between the substrate 3 and the static electricity elimination device 2 may be larger than or equal to 2 mm, for example, the distance between the substrate 3 and the static electricity elimination device 2 may be 2 mm, 3 mm, or 4 mm, etc. By means of the static electricity elimination device 2 below the substrate 3, the contact area between the ion wind generated from the static electricity elimination device 2 and the substrate 3 is increased, which improves static electricity elimination effect for the substrate 3.

As an example, referring to FIG. 1, the vent hole 11 may have an infundibular shape. The cross sectional area at an end of the vent hole 11 away from the substrate 3 is less than the cross sectional area at the other end.

By means of the infundibular vent hole 11, the contact area between the ion wind generated from the static electricity elimination device 2 and the substrate 3 may further be increased to improve static electricity elimination effect for the substrate 3.

Figure 3:
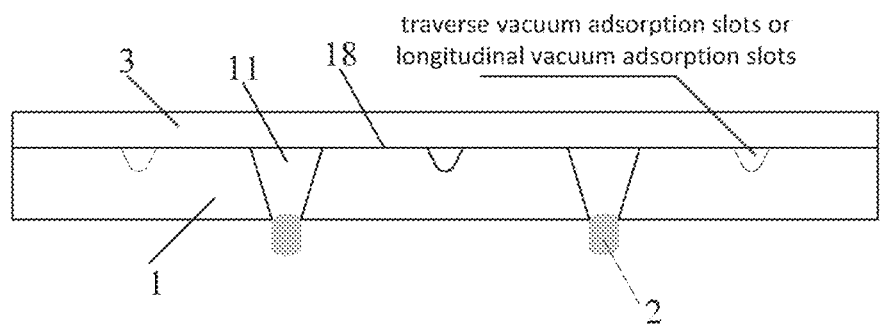
FIG. 3 is a schematic view showing a second construction of an insulation machine platform according to an embodiment of the present invention.

Referring to FIG. 3, as an example, in the second form of the static electricity elimination device 2, the static electricity elimination device 2 is located underneath the corresponding vent hole 11, and an air outlet of the static electricity elimination device 2 is mounted at an end of the corresponding vent hole 11 away from the supporting surface 18.

Since the static electricity elimination device 2 is mounted at an end of the corresponding vent hole 11 away from the supporting surface 18, all ion wind generated from the static electricity elimination device 2 may be directed to the substrate 3 above it by the static electricity elimination device 2 through the corresponding vent hole 11, which avoids loss of the ion wind, thus improves static electricity elimination effect for the substrate 3.

As an example, to avoid degrading adsorption effect of the non-vacuum adsorption zone 12 to the substrate 3, and to increase the contact area between the ion wind generated from the static electricity elimination device 2 and the substrate 3, the diameter (for example, maximum diameter) of the vent hole 11 may still be slightly larger than or equal to the diameter (for example, maximum diameter) of the static electricity elimination device 2, or the vent hole 11 has an infundibular shape, and the cross sectional area at an end of the vent hole 11 away from the supporting surface 18 is less than that at the other end.

Figure 4:
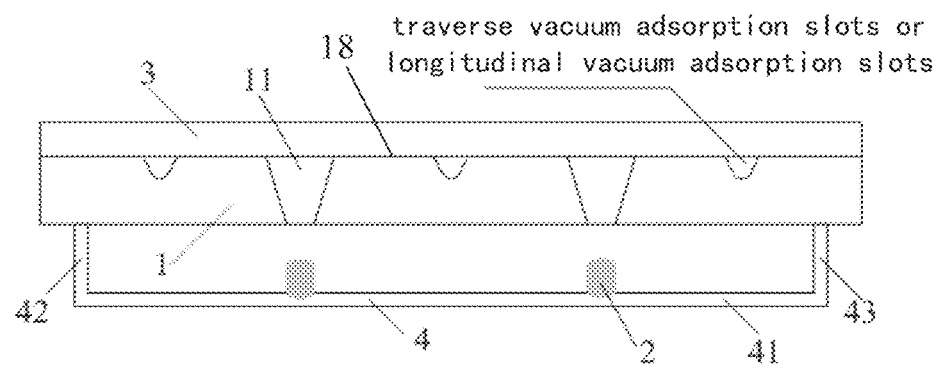
FIG. 4 is a schematic view showing a third construction of an insulation machine platform according to an embodiment of the present invention.

Referring to FIG. 4, as an example, in the third form of the static electricity elimination device 2, the static electricity elimination device 2 is mounted just underneath the corresponding vent hole 11.

Since the static electricity elimination device 2 is mounted just underneath the corresponding vent hole 11, all or most of ion wind generated from the static electricity elimination device 2 may be directed to the substrate 3 above it by the static electricity elimination device 2 through the corresponding vent hole 11, which improves static electricity elimination effect for the substrate 3.

In an example, to reduce loss of the ion wind generated from the static electricity elimination device 2 during transfer, the distance between the static electricity elimination device 2 and the machine platform body 1 should not be overlarge, generally, it is available to be less than or equal to 15 cm. For example, the distance between the static electricity elimination device 2 and the machine platform body 1 may be 15 cm, 10 cm, or 5 cm, etc.

As an example, referring to FIG. 4, the insulation machine platform may also comprises: a mounting device 4, which is used for mounting the static electricity elimination device 2 just underneath the corresponding vent hole 11.

In an example, the mounting device 4 includes a traverse rod 41, a first vertical rod 42, and a second vertical rod 43, two ends of the traverse rod 41 are connected to an end of the first vertical rod 42 and an end of the second vertical rod 43, respectively, while the other end of the first vertical rod 42 and the other end of the second vertical rod 43 are both mounted onto the machine platform body 1, and the traverse rod 41 is located just underneath the one or more vent holes 11. The static electricity elimination device 2 is mounted onto the traverse rod 41 and located just underneath the corresponding vent hole 11.

In the third form of the static electricity elimination device 2, to avoid affecting adsorption effect of the non-vacuum adsorption zone 12 to the substrate 3, and to increase the contact area between the ion wind generated from the static electricity elimination device 2 and the substrate 3, the diameter (for example, maximum diameter) of the vent hole 11 is still slightly larger than or equal to the diameter of the static electricity elimination device 2, or the vent hole 11 has an infundibular shape, and the cross sectional area at an end of the vent hole 11 away from the substrate 3 is less than that at the other end.

Figure 5:
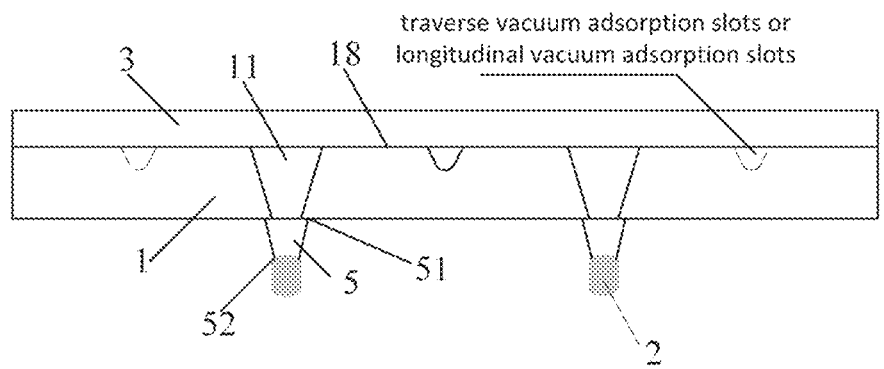
FIG. 5 is a schematic view showing a fourth construction of an insulation machine platform according to an embodiment of the present invention.

Referring to FIG. 5, as an example, in the fourth form of the static electricity elimination device 2, an air guide device 5 corresponding to the static electricity elimination device 2 is provided, which has a first end 51 and a second end 52, and the first end 51 is mounted at an end of the vent hole 11 away from the supporting surface 18, and an air outlet of the static electricity elimination device 2 is mounted at the second end 52 of the air guide device 5.

Since the air guide device 5 is mounted at an end of the vent hole 11 away from the substrate 3, all ion wind generated from the static electricity elimination device 2 may be directed into the substrate 3 by the static electricity elimination device 2 through the air guide device 5, which improves static electricity elimination effect for the substrate 3.

In an example, the air guide device 5 has an infundibular shape, in which its cross sectional area at the second end 52 is less than that at the first end 51.

The infundibular shape of the air guide device 5 may contribute to suppressing loss of the ion wind, and accelerate transferring speed of the ion wind in the air guide device 5.

In the fourth form of the static electricity elimination device 2, to avoid affecting adsorption effect of the non-vacuum adsorption zone 12 to the substrate 3, and to increase the contact area between the ion wind generated from the static electricity elimination device 2 and the substrate 3, the diameter of the vent hole 11 is still slightly larger than or equal to the diameter of the static electricity elimination device 2, or the vent hole 11 has an infundibular shape, and the cross sectional area at an end of the vent hole 11 away from the substrate 3 is less than that at the other end.

In an embodiment of the present invention, the static electricity elimination device 2 may be an ion-stick, which has a vent opening including one or more vent holes.

Figure 6:
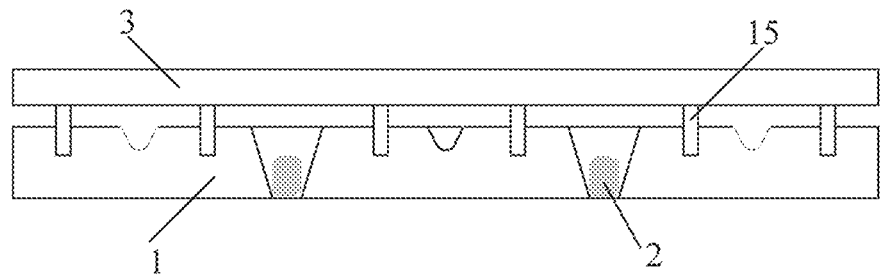
FIG. 6 is a schematic view showing a separation process of a substrate from the insulation machine platform according to an embodiment of the present invention.

Referring to FIG. 6, when the substrate 3 is separated from the machine platform body 1, firstly nitrogen or purifying air is fed into the traverse vacuum adsorption slots 13 and the longitudinal vacuum adsorption slots 14 to destroy vacuum environment, such that the non-vacuum adsorption zones 12 fail to adsorb the substrate 3, then supporting needles 15 in the machine platform body 1 rise up to separate the substrate 3 from the machine platform body 1.

In an example, at the moment that the substrate 3 is separated from the machine platform body 1, all or most of ion wind generated from the static electricity elimination devices 2 may be directed to the substrate 3 by the static electricity elimination devices 2 located underneath the substrate 3 through the vent holes 11 of the machine platform body 1. By means of the ion wind, which contains a lot of electric charges, the instantaneous static electricity accumulated on the substrate 3 may be neutralized, thereby the instantaneous static electricity generated at the moment that the substrate 3 is separated from the machine platform body 1 is eliminated effectively, to prevent an electric circuit and pixel structures on the substrate 3 from being destroyed.

In the embodiment of the present invention, since there are vent holes 11 in the machine platform body 1 and the static electricity elimination device are located underneath the substrate 3, all or most of ion wind generated from the static electricity elimination devices 2 may be directed to the substrate 3 by the static electricity elimination devices 2 through the vent holes 11, to improve static electricity elimination effect for the substrate 3, and the instantaneous static electricity generated at the moment that the substrate 3 is separated from the machine platform body 1 is eliminated effectively, to prevent an electric circuit and pixel structures on the substrate 3 from being destroyed.

An embodiment of the present invention also provides a substrate-contact type apparatus including the insulation machine platform according to any one of the above embodiments.

In an example, the substrate-contact type apparatus may be a non-vacuum substrate-contact type apparatus.

In the embodiment of the present invention, since there are vent holes 11 in the machine platform body of the non-vacuum substrate-contact type apparatus and the static electricity elimination devices are located underneath the substrate, all or most of ion wind generated from the static electricity elimination devices may be directed to the substrate by the static electricity elimination devices through the vent holes, to improve static electricity elimination effect for the substrate, and the instantaneous static electricity generated at the moment that the substrate is separated from the machine platform body is eliminated effectively, to prevent an electric circuit and pixel structures on the substrate from being destroyed.

Figure 7:
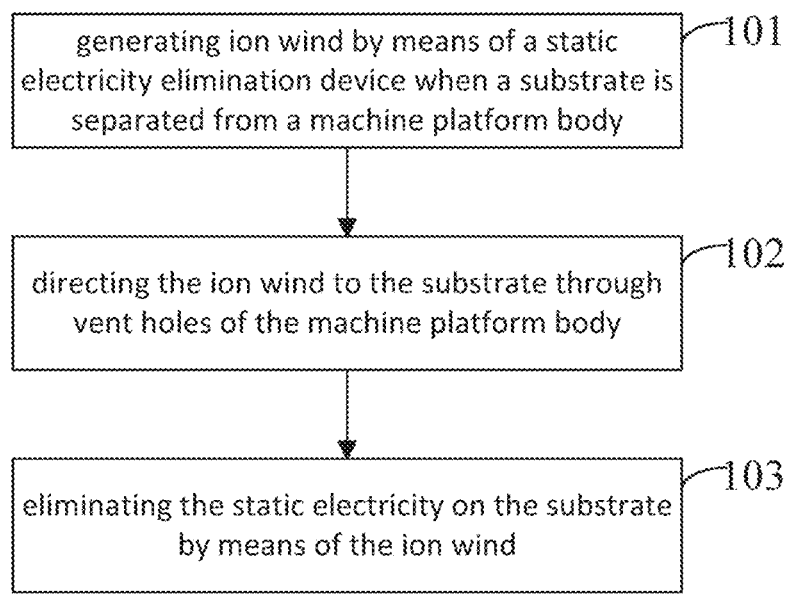
FIG. 7 is a flow chart illustrating a static electricity elimination method according to an embodiment of the present invention.

An embodiment of the present invention provides a static electricity elimination method, which may carry out static electricity elimination on the substrate placed on the insulation machine platform by means of, for example, the insulation machine platform as described in any of the above embodiments. Referring to FIG. 7, the method comprises steps of:

step 301: generating ion wind by means of a static electricity elimination device when a substrate is separated from a machine platform body;

step 302: directing the ion wind to the substrate by means of vent holes in the machine platform body; and step 303: eliminating the static electricity on the substrate by means of the ion wind.

In an example, in case that the static electricity elimination devices are connected to the vent holes by the air guide devices, the ion wind generated from the static electricity elimination devices may firstly be directed into the air guide devices, transferred to the vent holes from the air guide devices, then directed to the substrate from the vent holes.

In the embodiment of the present invention, since there are vent holes in the machine platform body and the static electricity elimination devices are located underneath the substrate, all or most of ion wind generated from the static electricity elimination devices may be directed to the substrate through the vent holes in the machine platform body, to improve static electricity elimination effect for the substrate, and the instantaneous static electricity generated at the moment that the substrate is separated from the machine platform body is eliminated effectively, to prevent an electric circuit and pixel structures on the substrate from being destroyed.

Although several exemplary embodiments have been shown and described, the present invention is not limited to those and it would be appreciated by those skilled in the art that various changes, equivalents or modifications may be made in these embodiments without departing from the principles and spirit of the disclosure, which should fall within the scope of the present invention. The scope of the invention is defined by the claims and their equivalents.

What is claimed is:

1. An insulation machine platform, comprising:
a machine platform body including at least one vent hole,
at least one static electricity elimination device; and
an air guide device having a first end and a second end;
wherein said at least one vent hole corresponds to said at least one static electricity elimination device being located at a position corresponding to said at least one vent hole, respectively,
wherein the machine platform body has a supporting surface, underneath which the static electricity elimination device is located, for receiving a substrate;
wherein the first end of the air guide device is mounted at an end of the vent hole away from the supporting surface; and
wherein an air outlet of the static electricity elimination device is mounted at the second end of the air guide device.

2. The insulation machine platform according to claim 1, wherein the static electricity elimination device is located underneath a location on the supporting surface of the machine platform body where the substrate is received.

3. The insulation machine platform according to claim 1, wherein,
the static electricity elimination device is embedded in the vent hole; or,
an air outlet of the static electricity elimination device is mounted at an end of the vent hole away from the supporting surface; or,
the static electricity elimination device is mounted just underneath the vent hole.

4. The insulation machine platform according to claim 1, wherein,
the air guide device has an infundibular shape, in which its cross sectional area at the second end is less than that at the first end.

5. The insulation machine platform according to claim 1, wherein,
the vent hole has an infundibular shape, in which its cross sectional area at an end of the vent hole away from the supporting surface is less than that at the other end.

6. The insulation machine platform according to claim 1, wherein the vent hole has a diameter larger than or equal to a diameter of the static electricity elimination device.

7. The insulation machine platform according to claim 1, wherein the supporting surface is provided with at least one non-vacuum adsorption zone, and said at least one vent hole is evenly distributed in the non-vacuum adsorption zone of the insulation machine platform.

8. The insulation machine platform according to claim 7, wherein the supporting surface is provided with at least two non-vacuum adsorption zones, and any two non-vacuum adsorption zones adjacent to each other are partitioned by a vacuum adsorption slot.

9. The insulation machine platform according to claim 1, wherein the static electricity elimination device is an ion-stick.

10. A substrate-contact type apparatus comprising an insulation machine platform which includes:
a machine platform body including at least one vent hole,
at least one static electricity elimination device; and
an air guide device having a first end and a second end;
wherein said at least one vent hole corresponds to said at least one static electricity elimination device being located at a position corresponding to said at least one vent hole, respectively,
wherein the machine platform body has a supporting surface, underneath which the static electricity elimination device is located, for receiving a substrate;
wherein the first end of the air guide device is mounted at an end of the vent hole away from the supporting surface; and
wherein an air outlet of the static electricity elimination device is mounted at the second end of the air guide device.

11. The substrate-contact type apparatus according to claim 10, wherein the static electricity elimination device is located underneath a location on the supporting surface of the machine platform body where the substrate is received.

12. The substrate-contact type apparatus according to claim 10, wherein,
the static electricity elimination device is embedded in the vent hole; or,
an air outlet of the static electricity elimination device is mounted at an end of the vent hole away from the supporting surface; or,
the static electricity elimination device is mounted just underneath the vent hole.

13. The substrate-contact type apparatus according to claim 10, wherein,
the air guide device has an infundibular shape, in which its cross sectional area at the second end is less than that at the first end.

14. The substrate-contact type apparatus according to claim 10, wherein,
the vent hole has an infundibular shape, in which its cross sectional area at an end of the vent hole away from the supporting surface is less than that at the other end.

15. The substrate-contact type apparatus according to claim 10, wherein the vent hole has a diameter larger than or equal to a diameter of the static electricity elimination device.

16. The substrate-contact type apparatus according to claim 10, wherein the supporting surface is provided with at least one non-vacuum adsorption zone, and said at least one vent hole is evenly distributed in the non-vacuum adsorption zone of the insulation machine platform.

17. The substrate-contact type apparatus according to claim 10, wherein the static electricity elimination device is an ion-stick.

18. A static electricity elimination method, comprising steps of:
- generating ion wind via a static electricity elimination device when a substrate is separated from a machine platform body;
- directing the ion wind to the substrate through vent holes of the machine platform body via an air guide device having a first end and a second end; and
- eliminating the static electricity on the substrate by means of the ion wind,
- wherein the first end of air guide device is mounted at an end of the vent hole away from a supporting surface of the machine platform body; and
- wherein an air outlet of the static electricity elimination device is mounted at the second end of the air guide device.

* * * * *